(12) United States Patent
Benner et al.

(10) Patent No.: US 9,543,115 B2
(45) Date of Patent: Jan. 10, 2017

(54) ELECTRON MICROSCOPE

(71) Applicant: Carl Zeiss Microscopy GmbH, Jena (DE)

(72) Inventors: Gerd Benner, Aalen (DE); Marko Matijevic, Nuertingen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 248 days.

(21) Appl. No.: 14/552,607

(22) Filed: Nov. 25, 2014

(65) Prior Publication Data
US 2015/0144787 A1 May 28, 2015

(30) Foreign Application Priority Data
Nov. 25, 2013 (DE) .......................... 10 2013 019 855

(51) Int. Cl.
 *H01J 37/00* (2006.01)
 *H01J 37/26* (2006.01)
 *H01J 37/244* (2006.01)
 *H01J 37/141* (2006.01)

(52) U.S. Cl.
 CPC ............. *H01J 37/26* (2013.01); *H01J 37/141* (2013.01); *H01J 37/244* (2013.01)

(58) Field of Classification Search
 CPC ......... H01J 37/26; H01J 37/141; H01J 37/244
 USPC ...... 250/306, 307, 310, 311, 396 R, 396 ML
 See application file for complete search history.

(56) References Cited

U.S. PATENT DOCUMENTS

| | | | |
|---|---|---|---|
| 7,285,776 B2 | 10/2007 | Nakamura et al. | |
| 8,541,739 B2 * | 9/2013 | Benner | H01J 37/295 250/311 |
| 2010/0258719 A1 | 10/2010 | Benner et al. | |
| 2011/0210249 A1 * | 9/2011 | Benner | H01J 37/26 250/310 |
| 2013/0292566 A1 * | 11/2013 | Benner | H01J 37/244 250/307 |

FOREIGN PATENT DOCUMENTS

| DE | 869 994 C | 3/1953 |
|---|---|---|
| DE | 2 006 671 A1 | 8/1971 |

(Continued)

OTHER PUBLICATIONS

Brochure JEOL, JEM-100CXII, Electron Microscope, 1975-1986, pp. 1-21, 23-25, 27-35.

(Continued)

*Primary Examiner* — Michael Maskell
(74) *Attorney, Agent, or Firm* — Fish & Richardson P.C.

(57) ABSTRACT

An electron microscope includes an electron beam source, a first electromagnet, a second electromagnet and a detector. The field generated by the first electromagnet has an effect of three lenses subsequently arranged along the beam path. A first lens of these lenses is arranged upstream of the object plane and focuses the beam at the object plane. The second lens of these three lenses is arranged downstream of the object plane. The third lens of these three lenses generates an image of a diffraction plane of the second lens at the detector. The magnetic field generated by the second electromagnet has an effect of a fourth lens and can be changed in order to change a size of the image of the diffraction plane of the second lens on the detector.

20 Claims, 8 Drawing Sheets

(56) References Cited

FOREIGN PATENT DOCUMENTS

DE   10 2012 007 868 A1   10/2013
EP       2 239 758 A2   10/2010

OTHER PUBLICATIONS

K. Akashi et al., "A New Akashi High Resolution Transmission Electron Microscope "Model S-500", Provided With a New Second-Zone Objective Lens", Societe Francaise de Microscopic Electronique, 1970, p. 143-144.
German Office Action, with translation thereof, for corresponding DE application No. 10 2013 019 855.0, dated Sep. 6, 2014.

* cited by examiner

ELECTRON MICROSCOPE

CROSS-REFERENCE TO RELATED APPLICATION

The present application claims priority under 35 U.S.C. §119 to German Patent Application No. 10 2013 019 855.0, filed Nov. 25, 2013, the entire contents of which are incorporated by reference herein.

FIELD

The disclosure relates to electron microscopes.

BACKGROUND

The electron microscope is an important tool used, for example, in material analysis. A conventional transmission electron microscope (TEM) generates a magnified image of a sample on a space resolving image sensor. Conventional electron microscopes are also used to analyze a distribution of scattering angles experienced by electrons traversing a sample, wherein a diffraction image of the sample is analyzed in such systems.

Conventional electron microscopes are so-called in-lens systems including an electromagnet generating a magnetic field having an effect on the electron beam of two electron-optical lenses arranged in the beam path. An object mount is provided for mounting a sample to be analyzed in an object plane, wherein the object plane is arranged between the two electron-optical lenses. The electron-optical lens arranged in the beam path upstream of the object plane has a function of a condenser lens focusing the electron beam in the object plane. The electron-optical lens arranged in the beam path downstream of the object plane has a function of an objective lens generating a magnified image of the object plane. A projection system is arranged in the beam path downstream of the two electron-optical lenses, wherein the projection system has plural electron-optical lenses and generates a magnified image of a diffraction plane of the objective lens on a detector.

The detector may include a detector component centrally arranged on an optical axis of the objective lens and of the projection system in order to detect bright field electrons. Bright field electrons are electrons having traversed the sample substantially without scattering. The detector may further include plural detector components arranged at a distance from the optical axis in order to detect dark field electrons. Dark field electrons are electrons which have been significantly scattered upon traversing the sample.

A scanning electron microscope (SEM) includes a deflector arranged in the beam path upstream of the object plane in order to scan the focused electron beam across the sample such that image information relating to the object can be obtained by scanning the focused electron beam across the object and detecting intensities of bright field electrons and/or dark field electrons for a plurality of locations in the object plane.

The projection system used for imaging of the diffraction plane of the objective lens onto the detector has disadvantages in that it is complicated, since the diffraction plane to be imaged is arranged at a large distance from the lenses of the projection system, it is expensive and requires significant space such that a length of the beam path between an electron source and the detector is high.

SUMMARY

The disclosure seeks to provide an electron microscope having a simplified configuration and allowing imaging of a diffraction plane of an objective lens onto a detector.

According to some embodiments, an electron microscope includes an electron beam source configured to generate a beam of electrons having a predetermined kinetic energy; a detector arranged in a beam path of the beam; a first electromagnet arranged along the beam path between the electron beam source and the detector; a current supply configured to supply an adjustable excitation current to the first electromagnet; an object mount configured to mount an object in an object plane arranged within a magnetic field which can be generated by the first electromagnet; wherein the object plane is arranged along the beam path relative to the first electromagnet such and wherein the current supply is adjustable such that the magnetic field which can be generated by the first electromagnet has, on the beam, an effect of three electron-optical lenses traversed by the beam, wherein a first lens of the three electron-optical lenses is arranged along the beam path upstream of the object plane and wherein the first lens is configured to focus the beam of electrons at the object plane, wherein a second lens of the three electron-optical lenses is arranged along the beam path downstream of the object plane, the second lens having a diffraction plane, wherein a third lens of the three electron-optical lenses is arranged along the beam path downstream of the second lens, wherein the third lens generates an image of the diffraction plane of the second lens at the detector.

The first lens of the three electron-optical lenses has a function of a condenser lens in that it is configured to focus the electron beam in the object plane. The second lens of the three electron-optical lenses has a function of an objective lens in that in generates a magnified image of the object plane, wherein the objective lens has a diffraction plane. The third lens of the three electron-optical lenses has a function of a diffraction lens in that it is configured to generate a magnified image of the diffraction plane of the objective lens in a plane which is arranged outside of the first electromagnet and where the detector is arranged.

The three electron-optical lenses can be provided by one single electromagnet. It is possible to modify the configuration of a conventional electron microscope having an electromagnet providing the function of a condenser lens and an objective lens such that the same electromagnet provides three electron-optical lenses. In the conventional electron microscope, the object mount mounts the object in an object plane located substantially at the center of the generated magnetic field, and the electromagnet is, depending on the kinetic energy of the electron beam traversing the object plane, energized such that the generated magnetic field provides the function of the condenser lens arranged upstream of the object plane and the function of the objective lens provided downstream of the object plane. Compared to the conventional electron microscope, the object mount of the illustrated embodiment is modified such that the object is mounted in an object plane which is not arranged substantially at the center of the generated magnetic field. The object plane of the illustrated embodiment is arranged upstream of the center of the generated magnetic field, such that the generated magnetic field provides one electron-optical lens arranged upstream of the object plane and two electron-optical lenses downstream of the object plane.

According to exemplary embodiments, the object mount mounts the object in a plane which is arranged at a distance of more than 1.5 mm or more than 2 mm or more than 3 mm from the center of the magnetic field. A distance between the plane of the object and the center of the magnetic field can also be greater than 0.5 times, greater than 0.20 times, or greater than 0.30 times of the halfwidth of a field distribution of the magnetic field generated by the first electromagnet, wherein the center of the magnetic field can be defined as the expectation value of a location, i.e. the center of gravity, of a distribution of an intensity of the magnetic field generated by the first electromagnet along the beam path or the optical axis of the electron microscope. The halfwidth of the magnetic field is the distance between those two locations along the optical axis at which the magnetic field strength has a value of 0.5 times the maximum value of the intensity of the magnetic field along the optical axis. If the field distribution of the magnetic field is symmetric, the center of the magnetic field coincides with the location of the maximum value of the magnetic field strength.

It is thus possible to produce, with one single magnet, a magnified image of the diffraction plane of the objective lens of the electron microscope in a plane arranged at a sufficient distance from the first electromagnet such that a detector for detecting electrons can be arranged in that plane. A separate projection system as used in the conventional electron microscope for imaging of the diffraction plane is not required, accordingly.

According to exemplary embodiments, the electron microscope includes a second electromagnet arranged along the beam path between the first electromagnet and the detector, wherein a magnetic field which can be generated by the second electromagnet has, on the beam, an effect of a fourth electron-optical lens, and wherein the current supply is configured to change a size of the image of the diffraction plane of the second lens at the detector by changing an excitation current supplied to the second electromagnet.

It is thus possible to change a location from the optical axis at which electrons are incident on the detector which have been scattered in the object plane by a given scattering angle. It is also possible to selectively detect electrons having been scattered in the object plane by different angles or angular ranges using a detector component arranged at a predetermined distance from the optical axis. It is thus possible to perform methods referred to as "annular dark field imaging".

According to exemplary embodiments, the second lens having the function of the objective lens generates an image of the object plane, wherein the image is located within the magnetic field generated by the first electromagnet.

According to further exemplary embodiments, such image of the object plane is arranged along the beam path upstream of a main plane of the third lens.

According to exemplary embodiments, the detector includes a first detector component including an electron-sensitive surface arranged within a circle having a first diameter. The first diameter can be selected in accordance with an opening angle of the electron beam focused onto the object plane such that electrons traversing the object plane without being scattered are incident on the first detector component, and such that electrons scattered at the object plane by a significant angle are not incident on the first detector component, if the second electromagnet is substantially not energized or only slightly energized such that an optical power of the fourth electron-optical lens is absent or only small. In such situation, the first detector component detects bright field electrons. If the excitation of the second electromagnet is then increased such that the fourth lens has a higher focusing power, also dark field electrons will be incident on the first detector component. The higher the excitation of the second electron magnet is, the more dark field electrons are incident on the first detector component.

According to exemplary embodiments herein, the electron-sensitive surface of the first detector component is located outside of a circle having a second diameter, wherein the second diameter is smaller than the first diameter. The first detector component does then not detect electrons incident on the image plane of the diffraction plane within the circle having the second diameter. The second diameter can be selected such that bright field electrons are incident on the plane of the image of the diffraction plane within the circle having the second diameter when the second electromagnet is excited such that dark field electrons are incident on the first detector component. The first detector component does then not detect bright field electrons, and only dark field electrons are detected by the first detector component.

According to exemplary embodiments herein, the first detector component has a central aperture located within the circle having the second diameter, wherein electrons of the beam of electrons can traverse the central aperture. According to exemplary embodiments herein, an electron spectrometer is arranged downstream of the first detector component, such that a spectrum of the kinetic energies of electrons entering the electron spectrometer can be measured. It is thus possible to detect dark field electrons with the first detector component and to detect the energy spectrum of the bright field electrons traversing the first detector component.

According to exemplary embodiments, the detector includes a first detector component having an electron-sensitive surface located within a circle having a first diameter, and a second detector component having an electron-sensitive surface located outside of a circle having a third diameter, wherein the third diameter is greater than or equal to the first diameter. It is thus possible to detect bright field electrons with the first detector component and to detect dark field electrons with the second detector component.

According to exemplary embodiments herein, the electron-sensitive surface of the second detector component is located within a circle having a fourth diameter, wherein the fourth diameter is greater than the third diameter, such that the electron-sensitive surface of the second detector component may have the shape of a ring defined by the third and fourth diameters. A width of the ring defined by the difference of the fourth diameter and the third diameter can be selected such that only dark field electrons scattered in the object plane by a narrow range of scattering angles are incident on the second detector component. By changing the excitation of the second electromagnet which results in a change of the focusing power of the fourth electron-optical lens, it is possible to change the angular range of scattering angles experienced by the electrons incident on the second detector component. It is thus possible to perform methods referred to as "annular dark field imaging".

According to some embodiments, the second detector component is arranged in the beam path upstream of the first detector component and has an aperture traversed by electrons to be incident on the first detector component.

According to some embodiments, the electron microscope includes a third electromagnet arranged in the beam path between the electron beam source and the first electromagnet. The third electromagnet generates a magnetic field having an effect of a condenser lens on the beam of electrons, wherein this condenser lens images the electron beam source into an upstream front image plane of the first electron-optical lens or into an upstream front diffraction plane of the first electron-optical lens.

BRIEF DESCRIPTION OF THE DRAWINGS

The forgoing as well as other advantageous features of the disclosure will be more apparent from the following detailed description of exemplary embodiments with reference to the accompanying drawings. It is noted that not all possible embodiments necessarily exhibit each and every, or any, of the advantages identified herein.

DETAILED DESCRIPTION OF EXEMPLARY EMBODIMENTS

Figure 1:
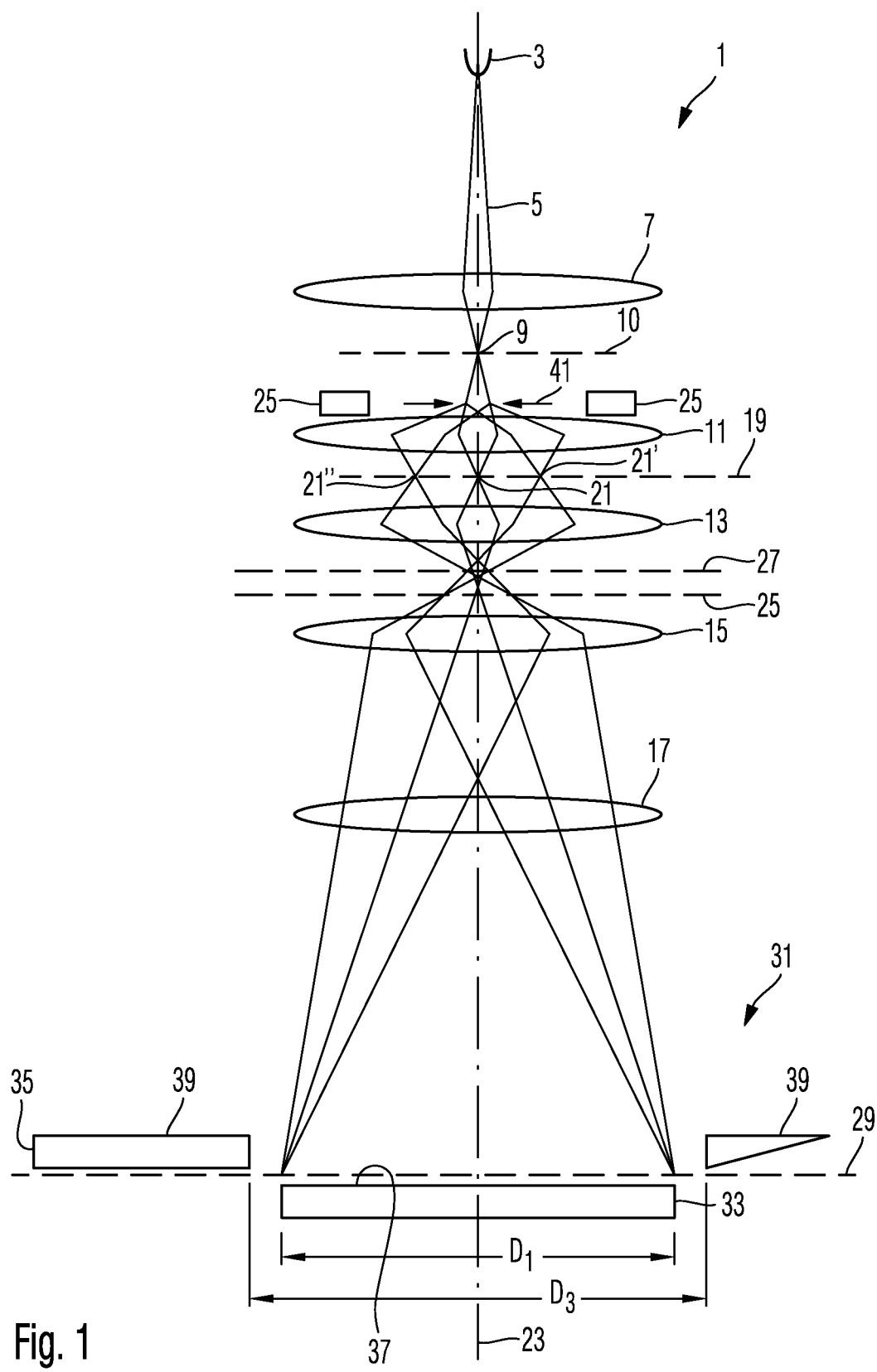
FIG. 1 is a schematic illustration of a beam path of an electron microscope according to a first embodiment.

In the exemplary embodiments described below, components that are alike in function and structure are designated as far as possible by alike reference numerals. Therefore, to understand the features of the individual components of a specific embodiment, the descriptions of other embodiments and of the summary of the disclosure should be referred to.

FIG. 1 shows a schematic illustration of a beam path of an electron microscope 1. The electron microscope 1 includes an electron beam source 3 generating a divergent electron beam 5. The electron beam 5 traverses at least one condenser lens 7 focusing the electron beam such that a cross-over 9 or an image of the electron beam source 3 is generated in a plane 10. The plane 10 is an upstream front image plane of a lens 11 illustrated in further detail below. The condenser lens 7 can be provided by a magnetic field generated by an electromagnet. Alternatively, the condenser lens 7 may generate an image of the electron beam source 3 in an upstream diffraction plane 59 (see FIG. 2) of the lens 11. Three electron-optical lenses 11, 13 and 15 are arranged in the beam path downstream of the cross-over 9. The three lenses 11, 13 and 15 are provided by a magnetic field generated by a first electromagnet as illustrated in further detail below. A fourth electron-optical lens 17 is arranged in the beam path downstream of the lens 15, wherein the fourth electron-optical lens 17 is provided by a magnetic field generated by a further, second electromagnet.

An object plane 19 is arranged between the lenses 11 and 13, and an object mount (not shown in FIG. 1) mounts an object to be inspected in the object plane 19. The lens 11 has a function of a condenser lens and focuses the electron beam 5 in the object plane 19. For this purpose, the lens 11 images the cross-over 9 into the object plane 19 and generates a further image of the electron beam source 3 in the object plane 19. The location 21 is located on an optical axis 23, wherein the electron beam source 3 and the lenses 7, 11, 13 and 15 are symmetrically centered relative to the optical axis 23. An electron deflector 25 is arranged in the beam path upstream of the object plane in order to deflect the electron beam 5 such that the location 21 at which the electron beam 5 is focused on the object plane 19 can be scanned across the object plane 19. FIG. 1 schematically illustrates two deflected electron beams focused on the object plane 19 at locations 21' and 21".

The lens 13 images the object plane 19 into a plane 25, and the lens 13 has a back diffraction plane 27.

The lens 15 generates a magnified image of the diffraction plane 27 at a plane 29 arranged in the beam path downstream of the lens 17. The plane 29 is located near to a detector 31. The detector 31 includes a central first detector component 33 and a second detector component 35 arranged as a ring surrounding the second detector component 33.

The first detector component 33 has an electron-sensitive surface 37 located within a circle having a diameter $D_1$. The second detector component 35 has an electron-sensitive surface 39 located outside of a circle having a diameter $D_3$.

An aperture plate 41 is arranged in the beam path upstream of the object plane 19. The aperture plate 41 has a circular aperture defining a convergence angle or opening angle of the electron beam 5 focused on the object plane 19. The diameter of the aperture of the aperture plate 41 can be adjustable, or an aperture plate having plural apertures with different diameters can be provided which can be selectively positioned within the beam path in order to change the convergence angle of the beam of electrons focused at the object plane 19.

The diameter $D_1$ of the electron-sensitive surface 37 of the first detector component 33 corresponds to the convergence angle of the electron beam 5 such that those electrons of the electron beam 5 which are not scattered by the object located in the object plane 19 are all incident on the electron-sensitive surface 37 of the first detector component 33. The first detector component 33 has a function of a bright field electron detector of the electron microscope 1, accordingly.

Electrons of the electron beam 5 which are scattered by the object located in the object plane 19 by a significant scattering angle are incident on the electron-sensitive surface 39 of the second detector component 35. The second detector component 35 has a function of a dark field detector, accordingly.

The beam path provided by the three lenses 11, 13 and 15 between the planes 10 and 29 will be illustrated in more detail with reference to FIG. 2 below.

Figure 2:
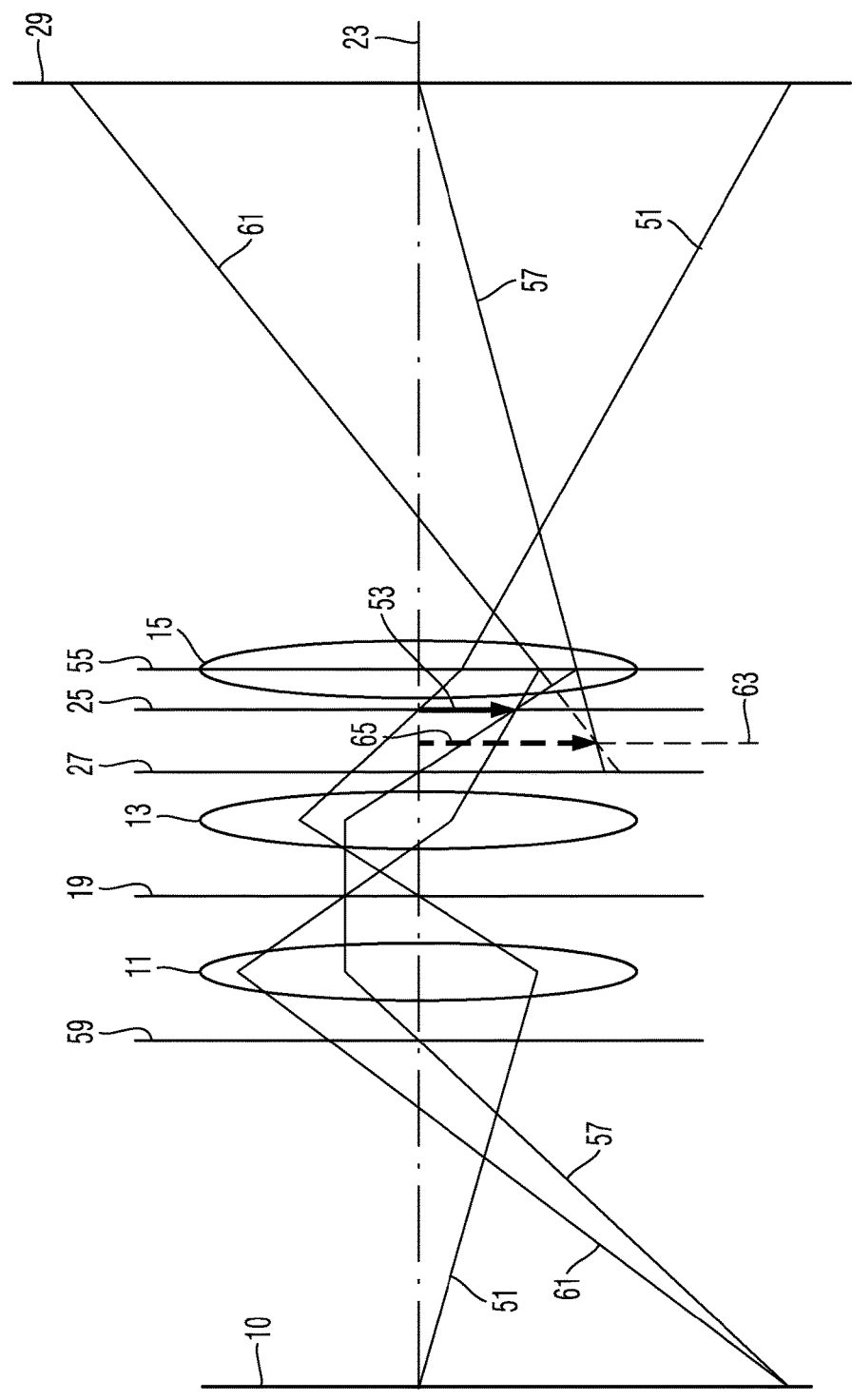
FIG. 2 is an illustration of details of the beam path shown in FIG. 1.

In FIG. 2, a line 51 represents an axial ray starting from the plane 10 and on the optical axis 23 with an angle relative to the optical axis 23. Since the lens 11 having the function of a condenser lens images the plane 10 into the object plane 19, the ray 51 intersects the optical axis 23 at the object plane 19. Subsequent to its intersection with the object plane 19, the ray 51 is deflected by the objective lens 13 towards the optical axis 23 such that the ray 51 intersects the optical axis 23 again in the plane 25. Thus, the plane 25 is an image plane of the object plane, and an image of the object plane 19 represented by an arrow 53 is generated in the plane 25.

The image plane 25 is arranged upstream from and at a small distance from a main plane 55 of the lens 15 such that the ray 51 traverses the lens 15 near the optical axis 23 and such that the ray 51 is deflected by the lens 15 only by a small amount.

Line 57 in FIG. 2 represents a field ray starting from plane 10 at a distance from the optical axis and under such an angle that it intersects the optical axis 23 at a front focal plane 59 of the condenser lens 11. Therefore, the ray 57 is oriented parallel to the optical axis 23 when it intersects the object plane 19. The ray 57 is deflected by the objective lens 13 such that it again intersects the optical axis 23 at the back focal plane or diffraction plane 27 of the objective lens 13. The lens 15 images the diffraction plane 27 of the objective lens 13 into the plane 29. For this purpose, the ray 57 is deflected by the lens 15 such that the ray 57 intersects the optical axis 23 at plane 29.

A line 61 in FIG. 2 represents a second field ray starting from plane 10 at the same distance from the optical axis as field ray 57. However, the field ray 61 starts from plane 10 under an angle which is different from the angle of field ray 57. The ray 61 intersects the ray 57 in the object plane 19 since the condenser lens 11 images the plane 10 into the object plane 19. A further point of intersection between the field rays 57 and 61 is formed in the plane 25, since the objective lens 13 images the object plane 19 into the plane 25. Due to the angle between the rays 57 and 61 in the plane 25 and due to the deflection by the lens 15, the rays 51 and 61 intersect the plane 29 at different locations. If the rays 51 and 61 are extended into the upstream direction starting from the plane 29, as this is indicated by broken lines in FIG. 2, the extended lines intersect at a plane 63. It is apparent that a virtual image of the object plane 19 is formed in plane 63. The virtual image of the object plane 19 is represented in FIG. 2 by an arrow 65 shown in broken lines. The real image 53 of the object plane 19 is formed in the plane 25 as illustrated above.

In the embodiment illustrated above, the electromagnet generating the magnetic field providing the condenser lens is excited such that the condenser lens 7 images the electron beam source 3 into the plane 10. If a different excitation of the electromagnet is used, the condenser lens 7 can image the electron beam source 3 into the front focal plane 59 of the lens 11. With such excitation and when the inspected object is a crystal, a discrete scattering image is formed in the planes 27 and 29 by Bragg-diffraction of the electron beam in the crystal. An aperture provided in the plane 10 can be used as a selection aperture for the diffracting region of the object.

Figure 3:
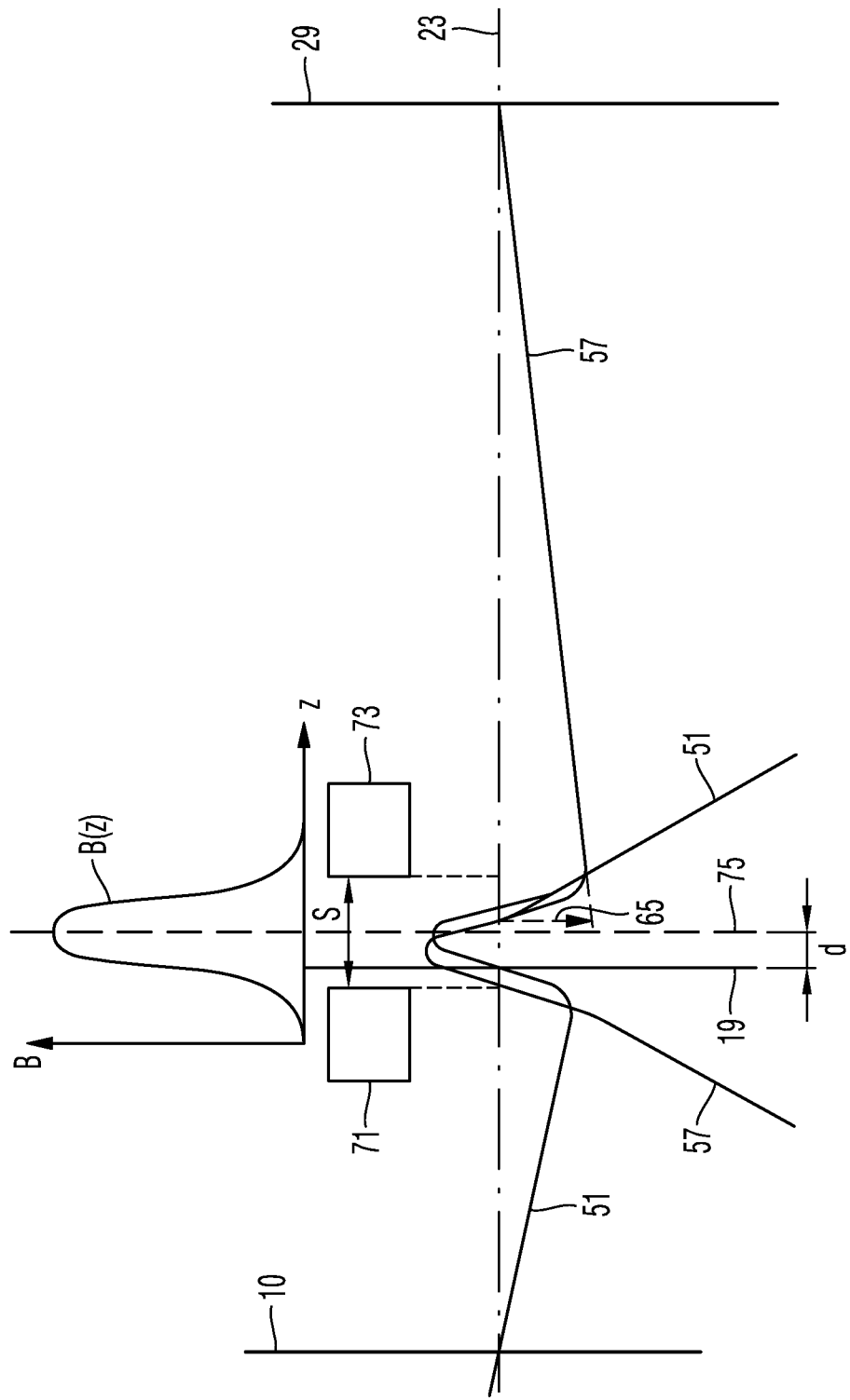
FIG. 3 is a further illustration of details of the beam path shown in FIG. 1.

FIG. 3 is a schematic representation further illustrating the beam path between the planes 10 and 29. The three lenses 11, 13 and 15 shown in FIGS. 1 and 2 are provided by the magnetic field generated by a single electromagnet. A pair of pole pieces 71 and 73 of the electromagnet is schematically illustrated in FIG. 3. The pole pieces 71 and 73 are spaced apart from each other along the optical axis 23 by a distance s. The magnetic field is generated by the electromagnet between the pole pieces 71 and 73. The field strength of the magnetic field in dependence of a location along the optical axis 23 is represented in FIG. 3 by a line B(z) in a diagram. Due to the symmetry of the electromagnet and, in particular, the symmetry of the pole pieces 71 and 73, the field strength of the magnetic field B(z) has a maximum arranged in the middle between the two pole pieces 71 and 73, and also the field strength of the magnetic field B(z) is symmetric relative to a plane 75 arranged at the center between the pole pieces 71 and 73. Even if the field strength of the magnetic field B(z) is not exactly symmetric relative to a central plane between the pole pieces 71 and 73, a central point or center of gravity of the field can be determined by determining the expectation value of the location for the function B(z), i.e. by determining the center of gravity of the magnetic field B(z). This center can be calculated by integrating the function B(z) along the optical axis 23, for example.

The axial ray 51 and the field ray 57 are shown in FIG. 3, wherein these rays are deflected by the magnetic field B(z). The axial ray 51 intersects the optical axis 23 at the object plane 19 where the object is to be mounted for the magnetic field B(z) having the effect of the three lenses 11, 13 and 15 on the electron beam as shown in FIG. 2. It is apparent that the object plane 19 is located upstream of and at a distance d from the central plane 75.

According to an exemplary embodiment, the distance s is 15 mm, the distance d is 3.21 mm and the maximum of the generated magnetic field has a field strength of 0.75 Tesla acting on an electron beam having a kinetic energy of 100 keV.

According to a further exemplary embodiment, the distance s is 10 mm, the distance d is 2.26 mm and the maximum of the generated magnetic field has a field strength of 1.124 Tesla acting on an electron beam having a kinetic energy of 100 keV.

The effect of the lenses 11, 13 and 15 has now being illustrated with reference to FIGS. 2 and 3. The effect of the lens 17 will be illustrated in more detail with reference to FIGS. 4 and 5 and to FIGS. 6 and 7 below.

Figure 4:
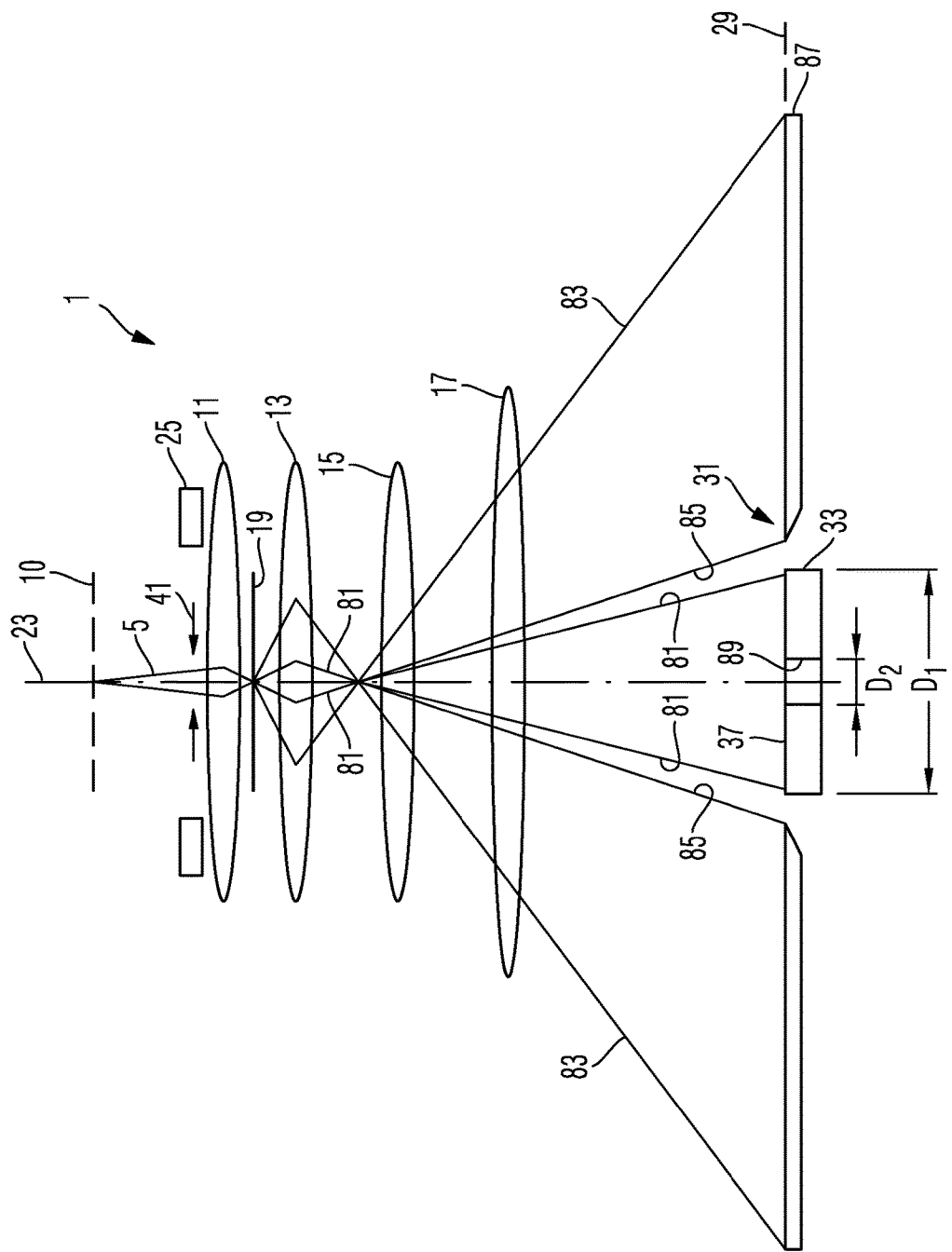
FIG. 4 is a schematic illustration of a beam path of an electron microscope according to a second embodiment in a first mode of operation.
Figure 5:
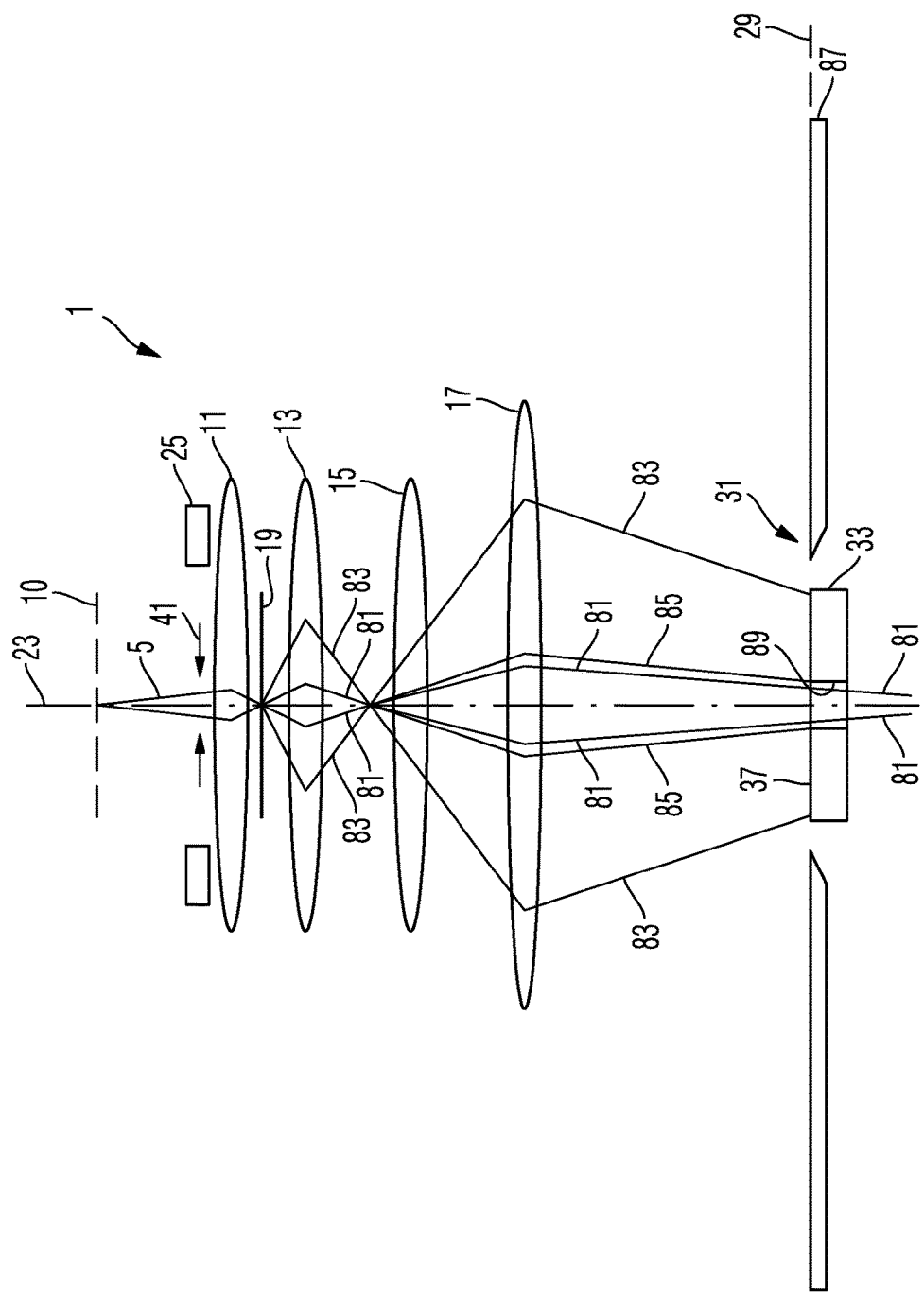
FIG. 5 is a schematic illustration of the beam path of the electron microscope shown in FIG. 4, in a second mode of operation.

FIG. 4 illustrates a first mode of operation of the electron microscope 1, and FIG. 5 illustrates a second mode of operation of the electron microscope 1. The two modes of operation differ with respect to a power of the lens 17 and, thus, with respect to an excitation of the second electromagnet generating the magnetic field providing the lens 17. In the mode of operation shown in FIG. 4, the electromagnet generating the magnetic field providing the lens 17 is substantially not excited such that the lens 17 has substantially no effect on the beam path. In the mode of operation shown in FIG. 5, the electromagnet generating the magnetic field providing the lens 17 is substantially excited such that the lens 17 has a focusing effect on the beam path.

The excitation of the electromagnet generating the magnetic field providing the lenses 11, 13 and 15 remains unchanged between the two modes of operation such that the lenses 11, 13 and 15 provide the effect on the beam path as illustrated with reference to FIGS. 2 and 3 above. This includes that the lens 11 images the plane 10 in which the image of the electron beam source 3 is formed, into the object plane 19 in which the object to be inspected is arranged, that the lens 13 has the function of an objective lens and that the lens 15 images the diffraction plane of the objective lens 13 into the plane 29 where the detector 31 is arranged. Lines 81 in FIGS. 4 and 5 represent outer envelope surfaces of a portion of the beam 5 of electrons traversing the object located in the object plane 19 substantially un-scattered. The electrons of this portion of the beam are referred to as bright field electrons, and they are all incident on the electron-sensitive surface 37 of the detector component 33. The detector component 33 is the only detector component of the detector 31 in this embodiment.

However, a portion of the electrons of the beam 5 is scattered by a significant scattering angle at the object arranged in the object plane, so that these electrons, which are also referred to as dark field electrons, travel on trajectories having an outer envelope surface indicated by lines 83 in FIGS. 4 and 5 and having inner envelope surfaces indicated by lines 85 in FIGS. 4 and 5. In the first mode of operation shown in FIG. 4, the dark field electrons are not incident on the electron-sensitive surface 37 of the detector component 33, while they are incident on an aperture plate 87 arranged in plane 29.

The second mode of operation illustrated in FIG. 5 is provided to detect dark field electrons using the detector component 33. For this purpose, the lens 17 is excited in the second mode of operation such that it has a sufficient power to deflect electrons traversing the lens 17 towards the optical axis such that trajectories of dark field electrons extending along the outer envelope surface 83 are still incident on the electron-sensitive surface 37 of the detector component 33. Thus, the detector component 33 may also detect dark field electrons.

However, also the bright field electrons can be incident on the electron-sensitive surface 37 of the detector component 33 such that the detector component 33 may not clearly differentiate between signals resulting from dark field electrons and signals resulting from bright field electrons. If it is desired that the detector component 33 detects only dark field electrons, the detector component 33 may be provided with a central aperture 89 such that the electron-sensitive surface 37 is defined by a radial inner edge of the electron-sensitive surface 37 extending along a circle having a second diameter $D_2$. The bright field electrons may traverse the detector component 33 through the central aperture such that they are not incident on the electron-sensitive surface 37 of the detector component 33. Alternatively, a circular aperture plate can be arranged in the beam path upstream of the electron-sensitive surface 37, wherein the aperture plate covers the electron-sensitive surface 37 and absorbs the incident bright field electrons. Such aperture can be provided such that it is displaceable and can be removed from the beam path. Moreover, plural circular apertures having different diameters can be provided, and these can be selectively positioned in the beam path. Alternatively, a similar aperture plates having corresponding functions can be arranged in the diffraction plane 27 of the objective lens 13.

If the bright field electrons traverse the detector component 33 through the aperture 89, they can be detected by a further detector arranged in the beam path downstream of the detector component 33. It is further possible to supply the beam of bright field electrons traversing the detector component 33 to an electron spectrometer in order to perform methods of energy loss spectroscopy.

The excitation of the lens 17 in the mode of operation shown in FIG. 5 has an effect that the image of the diffraction plane 27 of the second lens 13 is not exactly generated in the plane designated by reference numeral 29. While the components of the detector 31 are arranged at or close to the plane 29, the image of the diffraction plane 27 is formed upstream of the plane 29. Therefore, the components of the detector are not exactly positioned in that plane in which the image of the diffraction plane 27 of the second lens 13 is formed. This results in a loss of sharpness of the imaging in the plane where the detectors are arranged. However, such loss of sharpness can be neglected because the depth of focus of the imaging is sufficiently high. For example, a distance between the location on the optical axis 23 at which the image of the diffraction plane 27 of the second lens 13 is formed in the first mode of operation in which the lens 17 is not excited and the location on the optical axis 23 at which the image of the diffraction plane 27 of the second lens 13 is formed in the second mode of operation in which the lens 17 is excited may amount to 40 mm. Moreover, it is possible to displace the components of the detector 31 along the optical axis such that they are arranged approximately at a center between these two locations.

Figure 6:
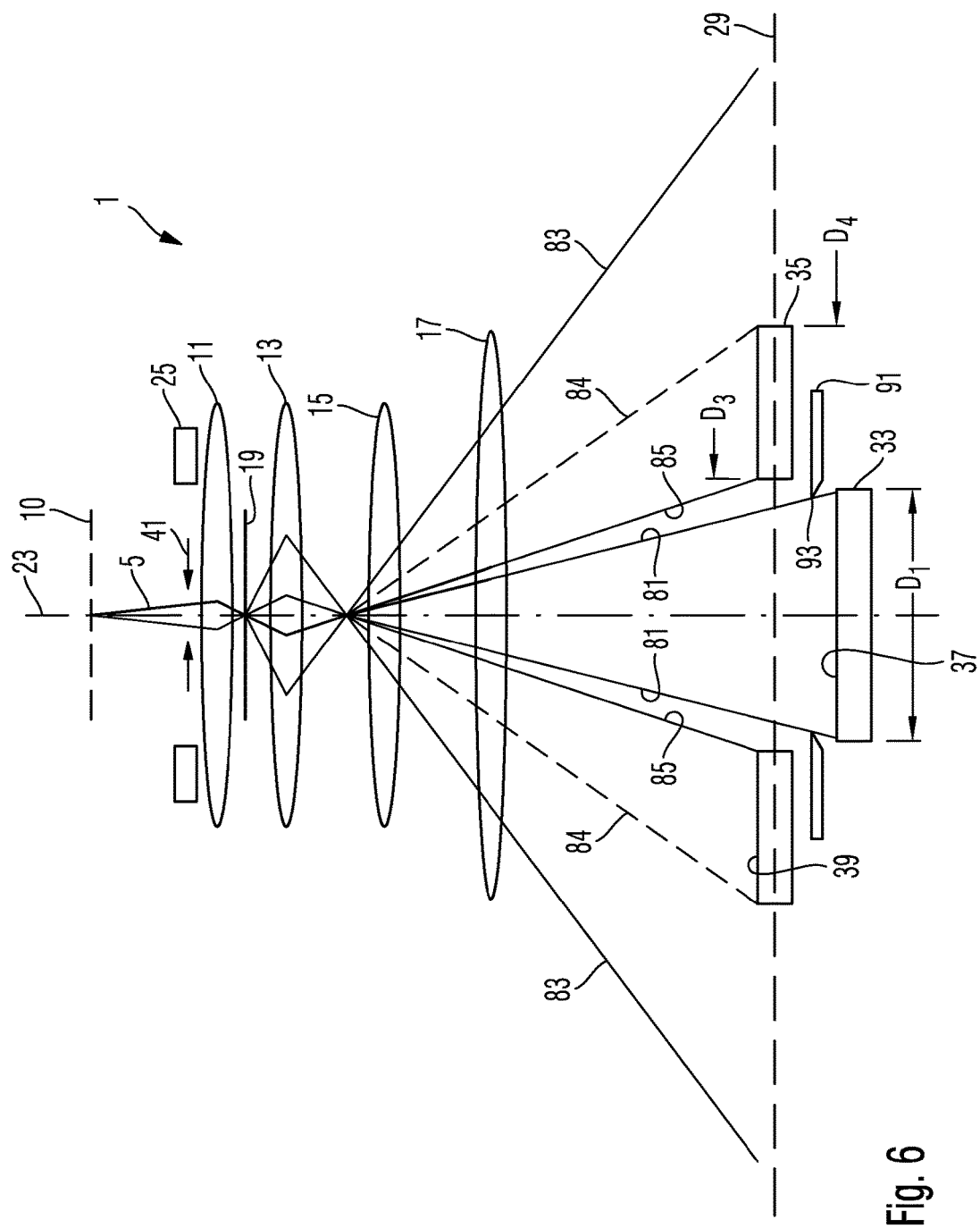
FIG. 6 is a schematic illustration of a beam path of an electron microscope according to a third embodiment in a first mode of operation.
Figure 7:
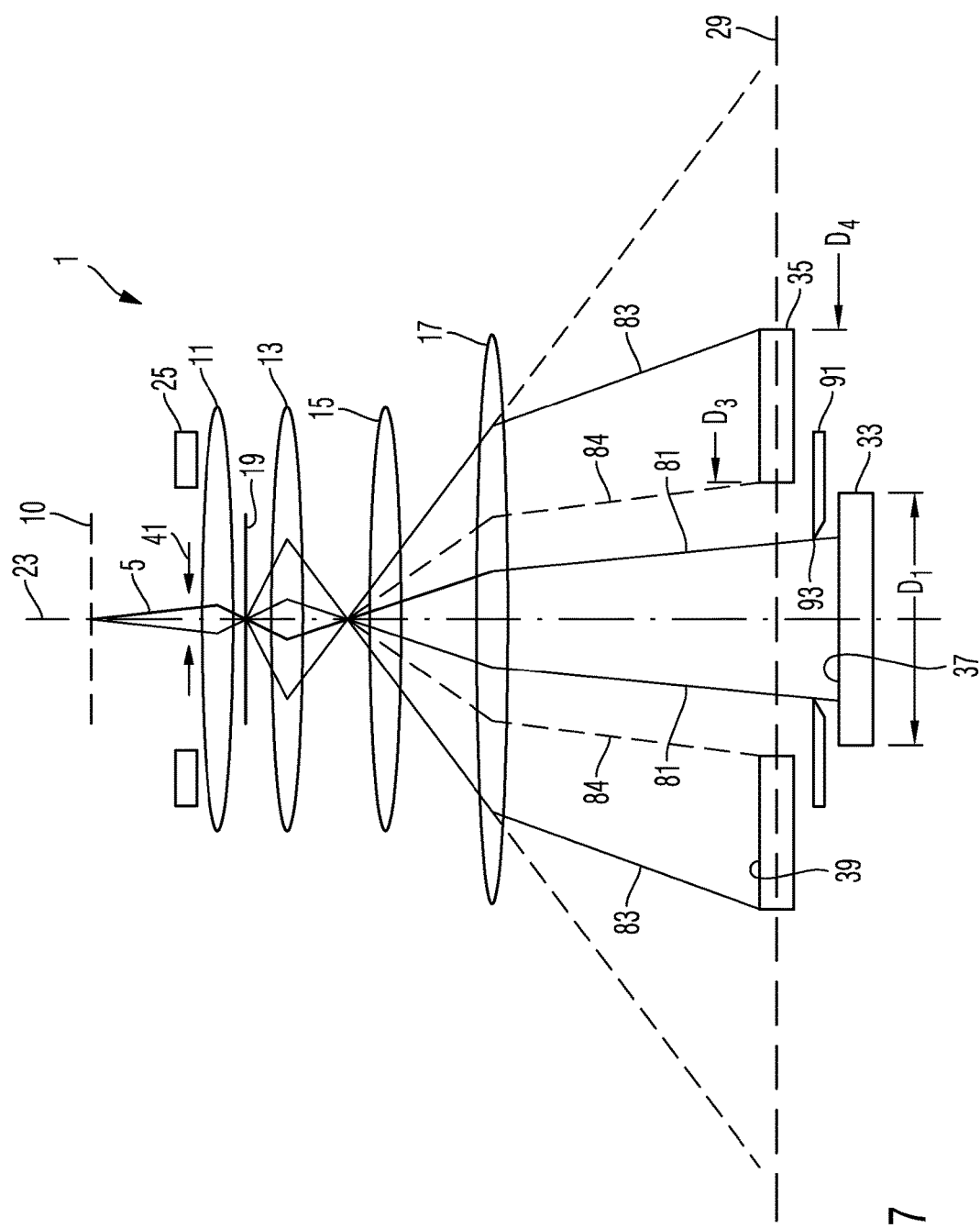
FIG. 7 is a schematic illustration of the beam path of the electron microscope shown in FIG. 6, in a second mode of operation.

FIGS. 6 and 7 show two modes of operation of a further embodiment of an electron microscope 1 differing from the embodiment illustrated with reference to FIGS. 4 and 5 above in having a detector which has two detector components 33 and 35 rather than one single detector component.

In the first mode of operation shown in FIG. 6, the lens 17 is substantially not excited, and the bright field electrons having trajectories extending in the interior of the outer envelope surface 81 are incident on an electron-sensitive surface 37 of the detector component 33.

The dark field electrons scattered in the object plane 19 and having trajectories extending between the outer envelope surface 83 and the inner envelope surface 85 include a portion of dark field electrons which are incident on an electron-sensitive surface 39 of the detector component 35. An inner diameter $D_3$ of the electron-sensitive surface 39 of the detector component 35 is selected such that those dark field electrons having trajectories extending along the inner envelope surface 85 are just incident on the electron-sensitive surface 39 of the detector component 35. These dark field electrons have experienced a relatively small scattering angle in the object plane 19. An outer diameter $D_4$ of the electron-sensitive surface 39 of the detector component 35 is selected such that dark field electrons having trajectories along a surface indicated in FIG. 6 by a broken line 84 are just incident on an outer edge of the electron-sensitive surface 39 of the detector component 35. These dark field electrons have experienced a moderate scattering angle at the object plane 19. Dark field electrons having experienced at the object plane 19 a scattering angle which is greater this moderate scattering angle and having trajectories extending between the surface 84 and the outer envelope surface 83 are not incident on the detector component 35. In the mode of operation shown in FIG. 6, the detector component 35 detects dark field electrons having experienced smaller scattering angles, such as scattering angles of less than 50 mrad. Such detection method can be referred to as "annular dark field analysis".

It is now possible to successively increase the excitation of the lens 17 such that the trajectories of the dark field electrons are deflected towards the optical axis 23, and the electron-sensitive surface 39 of the detector component 35 will detect dark field electrons experiencing greater and greater scattering angles.

FIG. 7 shows a mode of operation in which the excitation of the lens 17 is at its maximum, such that also those dark field electrons having trajectories extending along the outer envelope surface 83 are incident on the electron-sensitive surface 39 of the detector component 35. These dark field electrons have experienced a scattering angle of 200 mW. Those dark field electrons having experienced small scattering angles are then no longer incident on the electron-sensitive surface 39 of the detector component 35. Such mode of operation can be referred to as "high angle annular dark field analysis".

It is possible to selectively detect dark field electrons depending on their scattering angle by changing the excitation of the electromagnet generating the magnetic field providing the lens 17.

In the mode of operation shown in FIG. 7, also dark field electrons can be incident on the electron-sensitive surface 37 of the detector component 33. Due to the typically low intensity of the dark field electrons, as compared to the intensity of the bright field electrons, the bright field electron detection signal is not heavily distorted by the dark field electrons. If it is desired to only detect bright field electrons with the detector component 33, it is possible to arrange an aperture plate 91 having a central opening 93 in the beam path upstream of the electron-sensitive surface 37 of the aperture plate 91. This aperture plate can absorb dark field electrons and allow bright field electrons to traverse the aperture 93 towards the electron-sensitive surface 37 of the detector component 33. Herein, it is possible to design the aperture plate 91 such that the diameter of the aperture 93 can be varied, or, it is possible to provide plural aperture plates 91 having different diameters of their apertures 93 and to selectively arrange one of these plural aperture plates in the beam path. It is thus possible to adjust the diameter of the aperture 93 corresponding to different excitations of the lens 17 so that bright field electrons may traverse the aperture 93 while dark field electrons are absorbed by the aperture plate 91.

Figure 8:
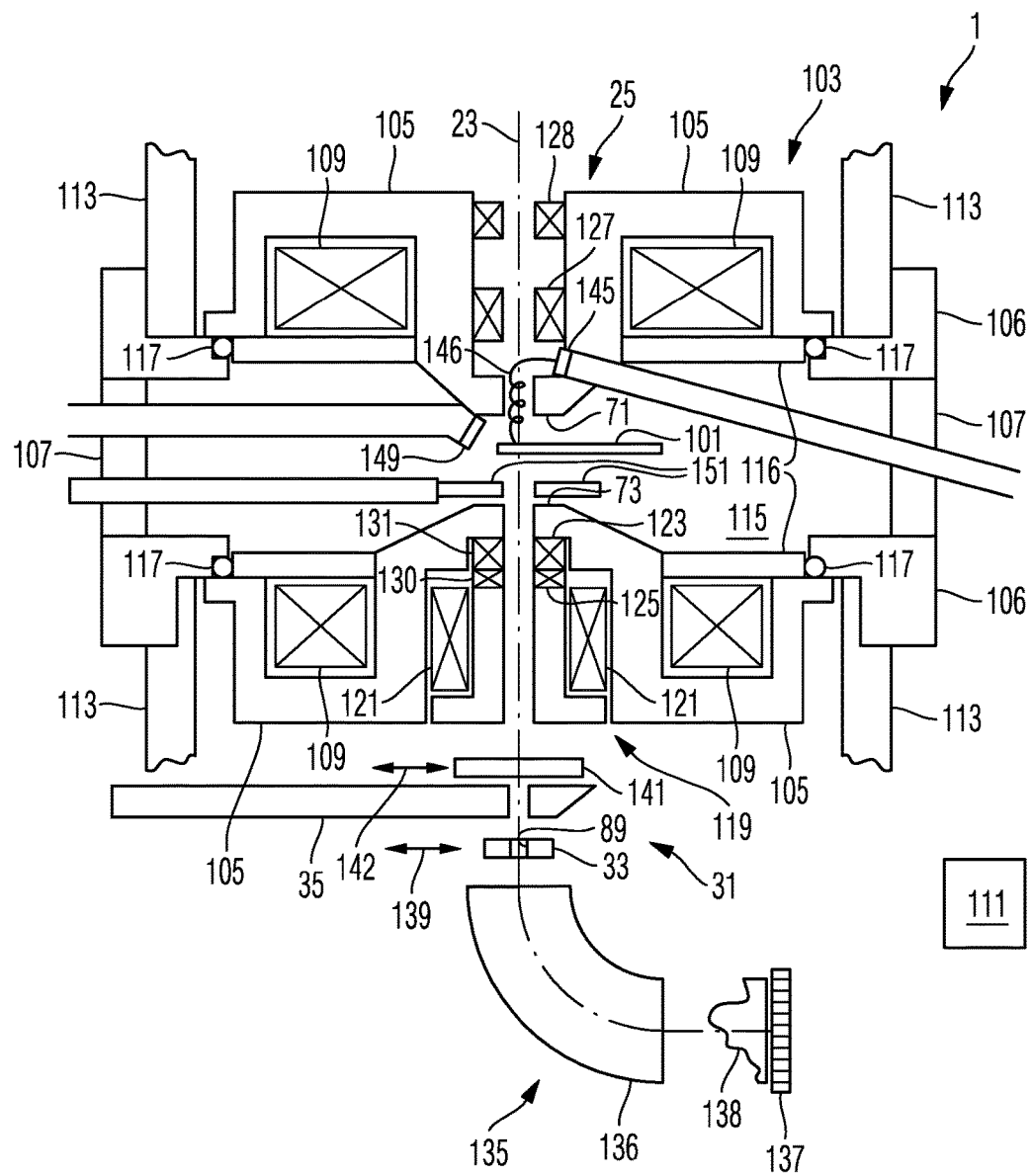
FIG. 8 is a schematic illustration of electromagnets and further components which can be used in implementing electron microscopes according to the embodiments shown in FIGS. 1 to 7.

FIG. 8 is an illustration of components of an embodiment of an electron microscope 1 as illustrated above, shown in the section along the optical axis 23.

FIG. 8 shows an object mount 101 mounting a sample to be analyzed using the electron microscope 1 at an object plane such that the optical axis 23 extends through the sample. The electron beam source and the condenser lens 7 illustrated with reference to FIG. 1 above are not shown in FIG. 8. A pole piece 71 (see FIG. 3) of a first electromagnet 103 is arranged in the beam path upstream of the object plane, and a pole piece 73 (see FIG. 3) of the first electromagnet 103 is arranged in the beam path downstream of the object plane. A path for a magnetic flux is provided between the pole pieces 71 and 73 by yokes 105 of the electromagnet and a housing 106. The housing 106 includes bores closed by flanges 107 allowing to insert components, such as detectors, aperture plates, manipulators etc. into a vacuum space of the electron microscope. The magnetic field provided between the pole pieces 71 and 73 is generated by coils 109 carrying a current provided by a current supply 111.

A vacuum enclosure of the electron microscope 1 is indicated in FIG. 8 by reference numeral 113 and is connected to the housing 106. The object mounted on the object mount 101 is located within a vacuum space 115 which is sealed relative to the coils 109 by plates 116 and seals 117.

The first electromagnet 103 generates the magnetic field between the pole pieces 71 and 73 by the coils 109, and this magnetic field provides the electron-optical lenses 11, 13 and 15 for the electron beam extending along the optical axis 23.

A second electromagnet 119 includes a coil 121 and pole pieces 123 and 125 arranged in the beam path downstream of the pole pieces 71 and 73. An excitation current is supplied to the second electromagnet 119 by the current supply 111 and generates a magnetic field between the pole pieces 123 and 125 providing the fourth electron-optical lens 17 illustrated above.

An electron deflector 25 is arranged in the beam path upstream of the object plane and includes two deflector elements 127 and 128 arranged at a distance from each other along the optical axis 23. The two deflector elements 127 and 128 have a function of a double deflector in order to provide a parallel displacement to the electron beam such that the electron beam can be scanned across the object plane.

According to an optional embodiment, a further electron deflector including one or two detector elements 130, 131 can be provided downstream of the object plane. This second deflector can be used to compensate a deflection of the electron beam away from the optical axis generated by deflector 25 such that the electron beam traverses the subsequent detection systems on the optical axis.

These detection systems include a detector of 31 having two detection components. The two detection components include a first detector component 33 for detecting bright field electrons and a second detector component 35 for detecting dark field electrons. The detector component 33 may have a central aperture 89 in order to allow, in the mode of operation illustrated with reference to FIG. 5 above, bright field electrons to traverse the detector component 33 such that they can be subsequently detected. The detection of the bright field electrons may be performed using an electron spectrometer 135 including a magnet 136 and a spatially resolving detector 137 in order to detect an energy loss spectrum schematically represented by a line 138 in FIG. 8.

It is, in particular, possible that the detector component 33 can be removed from the beam path as indicated by an arrow 139 in FIG. 8, such that the mode of operation illustrated with reference to FIG. 4 above can be performed in which all bright field electrons or even dark field electrons can be supplied to the electron spectrometer 135.

The detection system may further include a CCD camera 141 which can be used to detect diffraction images and which can be removed from the beam path as indicated by an arrow 142.

The electron microscope 1 may further include a detector 145 for detecting backscattered electrons or secondary electrons, wherein the detector 145 is arranged upstream of the object plane. A line 146 in FIG. 8 shows an exemplary trajectory of a backscattered secondary electron emanating from the object and detected by the detector 145.

The electron microscope 1 may further include detectors 149 and 151 arranged upstream or downstream of the object and which can detect x-rays depending on their energy in order to perform methods of energy discursive x-rays spectroscopy. Such x-ray detectors can be formed by silicone drift detectors, for example.

The x-ray detector 151 can be embodied as a flat silicone drift detector having plural detector segments.

The electron microscope 1 may include a suitable voltage supply configured to apply an adjustable voltage differing from the column potential to the object mount 101. It is then possible to adjust a landing energy of the electrons on an electrically conducting sample mounted on the object mount 101. It is further possible to provide additional electrodes in the beam path upstream or downstream of the object mount 101 in order to modify electric fields upstream and downstream of the object. Such electric fields may also have a function of electrostatic lenses on the electron beam. The effects of such electrostatic lenses can, however, be neglected relative to the effect provided by the three lenses 11, 13 and 15 provided by the magnetic field generated by the first electromagnet, such that such additional electrostatic lenses do substantially not influence the beam paths illustrated with reference to FIGS. 1 to 7 above. Moreover, if a particular potential of the object is desired and if the electric fields for this purpose provide electrostatic lenses which can not be neglected, it is possible to adjust the excitation of the electromagnet such that the combined effect of the magnetic fields and the electrostatic fields provides the three lenses and beam paths as illustrated with reference to FIGS. 1 to 7 above.

While the disclosure has been described with respect to certain exemplary embodiments thereof, it is evident that many alternatives, modifications and variations will be apparent to those skilled in the art. Accordingly, the exemplary embodiments of the disclosure set forth herein are intended to be illustrative and not limiting in any way. Various changes may be made without departing from the spirit and scope of the present disclosure as defined in the following claims.

What is claimed is:

1. An electron microscope, comprising:
an electron beam source configured to generate a beam of electrons having a predetermined kinetic energy;
a detector arranged in a beam path of the beam;
a first electromagnet arranged along the beam path between the electron beam source and the detector, the first electromagnet configured to produce a magnetic field;
a second electromagnet arranged along the beam path between the first electromagnet and the detector, the first electromagnet configured to produce a magnetic field;
a current supply configured to supply an adjustable excitation current to the first electromagnet and to supply an adjustable excitation current to the second electromagnet;
wherein:
an object plane of the electron microscope is arranged within the magnetic field which generated by the first electromagnet;
the object plane is along the beam path relative to the first electromagnet;
the current supply is adjustable so that the magnetic field generated by the first electromagnet has an effect on the beam of three electron-optical lenses traversed by the beam;
a first lens of the three electron-optical lenses is arranged along the beam path upstream of the object plane;
the first lens is configured to focus the beam of electrons at the object plane;
a second lens of the three electron-optical lenses is arranged along the beam path downstream of the object plane;
the second lens has a diffraction plane;
the third lens of the three electron-optical lenses is arranged along the beam path downstream of the second lens;
the third lens is configured to generate an image of the diffraction plane of the second lens at the detector;
the magnetic field which generated by the second electromagnet has, on the beam, an effect of a fourth electron-optical lens; and
the current supply is configured to change a size of the image of the diffraction plane of the second lens at the detector by changing the excitation current supplied to the second electromagnet.

2. The electron microscope of claim 1, further comprising an object mount configured to mount an object in the object plane of the electron microscope.

3. The electron microscope of claim 1, wherein the current supply is adjustable so that, during use of the electron microscope, the second lens generates an image of the object plane within the magnetic field.

4. The electron microscope of claim 3, wherein the image of the object plane is arranged along the beam path upstream of a main plane of the third lens.

5. The electron microscope of claim 1, wherein the detector comprises a first detector component comprising an electron-sensitive surface arranged within a circle having a first diameter.

6. The electron microscope of claim 5, wherein the electron-sensitive surface of the first detector component is located outside of a circle having a second diameter, and the second diameter is smaller than the first diameter.

7. The electron microscope of claim 6, wherein the first detector component has a central aperture located within the circle having the second diameter, and, during use of the electron microscope, electrons of the beam of electrons can traverse the central aperture.

8. The electron microscope of claim 7, further comprising an electron spectrometer arranged along the beam path downstream of the first detector component.

9. The electron microscope of claim 5, wherein the detector includes a second detector component, an electron-sensitive surface of the second detector component is located outside of a circle having a second diameter, and the second diameter is greater than the first diameter.

10. The electron microscope of claim 9, wherein electron-sensitive surface of the second detector component is located within a circle having a fourth diameter, and the fourth diameter is greater than the third diameter.

11. The electron microscope of claim 9, wherein the second detector component is arranged along the beam path upstream of the first detector component, and the second detector component has an aperture which, during use of the electron microscope, is traversed by electrons of the beam of electrons in order to be incident on the first detector component.

12. The electron microscope of claim 9, wherein the detector comprises a third detector component comprising an array of detector pixels and configured to detect a space-resolved image of the diffraction plane of the second lens.

13. The electron microscope of claim 1, wherein an electron-sensitive surface of the detector is arranged along the beam path at a distance from a location where the image of the diffraction plane of the second lens is generated when the excitation current is not supplied to the second electromagnet.

14. The electron microscope of claim 13, wherein the distance is more than 10 mm.

15. The electron microscope of claim 14, wherein the distance is less than 60 mm.

16. The electron microscope of claim 1, wherein the distance is less than 60 mm.

17. The electron microscope of claim 1, further comprising a third electromagnet arranged along the beam path between the electron beam source and the first electromagnet, wherein the third electromagnet is configured to generate a magnetic field having an effect on the beam of at least one condenser lens imaging the electron beam source into an upstream image plane of the first electron-optical lens.

18. The electron microscope of claim 1, further comprising a third electromagnet arranged along the beam path between the electron beam source and the first electromagnet, wherein the third electromagnet is configured to generate a magnetic field having an effect on the beam of at least one condenser lens imaging the electron beam source into an upstream diffraction plane of the first electron-optical lens.

19. The electron microscope of claim 1, further comprising an electron deflector arranged along the beam path between the electron beam source and the object plane, wherein the electron deflector is configured to displace a location in the object plane at which the beam is focused.

20. A method, comprising:
using the electron microscope of claim 1 to investigate a sample.

* * * * *